US012628287B2

(12) United States Patent
Ribeiro et al.

(10) Patent No.: US 12,628,287 B2
(45) **Date of Patent: \*May 12, 2026**

(54) APPARATUS FOR SECURING AN ELECTRONIC DEVICE TO A SUPPORT STRUCTURE AND ELECTRONIC DEVICE INCORPORATING SAME

(71) Applicant: UBICQUIA, INC., Fort Lauderdale, FL (US)

(72) Inventors: Claudio Santiago Ribeiro, Evanston, IL (US); Cesar Eduardo Nunez, Miramar, FL (US); Steven Kenneth Mackiewicz, Shorewood, IL (US); Stephen M. Oshgan, Arlington Heights, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/211,571

(22) Filed: Jun. 19, 2023

(65) Prior Publication Data

US 2023/0337375 A1      Oct. 19, 2023

Related U.S. Application Data

(60) Division of application No. 17/695,779, filed on Mar. 15, 2022, now Pat. No. 12,336,120, which is a continuation-in-part of application No. 29/767,115, filed on Jan. 20, 2021, now Pat. No. Des. 1,002,358.

(51) Int. Cl.
| | |
|---|---|
| *H05K 5/02* | (2006.01) |
| *H01R 13/639* | (2006.01) |
| *H01R 24/68* | (2011.01) |

(52) U.S. Cl.
CPC ......... *H05K 5/0204* (2013.01); *H01R 13/639* (2013.01); *H05K 5/0221* (2013.01); *H05K 5/0226* (2013.01); *H01R 24/68* (2013.01)

(58) Field of Classification Search
CPC ...................................................... H05K 5/00
See application file for complete search history.

(56) References Cited

U.S. PATENT DOCUMENTS

| | | | |
|---|---|---|---|
| 2018/0238359 A1* | 8/2018 | Cross ...................... F41C 23/04 |
| 2020/0240620 A1* | 7/2020 | Chamberlain .......... F21V 15/01 |

FOREIGN PATENT DOCUMENTS

KR          2185333 B1  *  12/2020

* cited by examiner

*Primary Examiner* — Jerry Wu
(74) *Attorney, Agent, or Firm* — Daniel C. Crilly

(57) ABSTRACT

An electronic device mountable to a support structure includes a housing, a coupling member, a clamp member, and a latch mechanism. The coupling member has an electronic device support portion and a clamp support portion. The device support portion is coupled to the housing. The clamp support portion extends from one end of the device support portion in a direction substantially normal to the device support portion. The clamp member includes a base, a first arched clamp portion, a second arched clamp portion, and a hinge. The base is coupled to the coupling member's clamp support portion. The first clamp portion is attached to the base. The hinge pivotally couples the first ends of the two clamp portions such that the arch shapes of the two clamp portions oppose each other. The latch mechanism is configured to latch the second ends of the two clamp portions to the support structure.

18 Claims, 8 Drawing Sheets

APPARATUS FOR SECURING AN ELECTRONIC DEVICE TO A SUPPORT STRUCTURE AND ELECTRONIC DEVICE INCORPORATING SAME

CROSS-REFERENCE TO RELATED APPLICATIONS

The present application is a division of U.S. application Ser. No. 17/695,779, which was filed on Mar. 15, 2022, and is incorporated herein by this reference in its entirety. U.S. application Ser. No. 17/695,779 is a continuation-in part of U.S. Design patent application Ser. No. 29/767,115, which was filed on Jan. 20, 2021, and is incorporated herein by this reference in its entirety.

TECHNICAL FIELD

The present disclosure relates generally to mounting of electronic devices and, more particularly, to an apparatus for mounting an electronic device to a support structure, such as a streetlight, and an electronic device that includes such an apparatus.

BACKGROUND

Clamping structures are commonly used to mount equipment to structures. In particular, clamping structures can use opposing semi-circular halves that are bolted together on each side around a cylindrical pole section. These halves a sometimes referred to as being U-shaped or horseshoe shaped. To install these a worker generally puts one half on one side of the pole, then aligns the other half with the first half, and passes a respective bolt through each of the opposing ends. This operation generally requires both hands to do. Thus, if the equipment being mounted needs to be held during this process, another person is needed to hold the equipment, or some sort of assistance must be used to hold the equipment being mounted. One type of equipment that is being deployed presently are small cell access node devices. These devices may be mounted on existing lighting structures used to light roads and sidewalks in urban or city locales. Modern lighting structure include electrical connectors that can be used to power associated devices, like small cell access node devices. However, the use of prior art clamping structures to mount small cell access devices, and other types of electronic devices, to pole sections is inefficient and may require multiple personnel to install the equipment.

Therefore, a need exists to overcome the problems with the prior art as discussed above.

SUMMARY

Exemplary embodiments of the present disclosure provide a clamp assembly for mounting a small cell access node device to a pole section of a light structure. The clamp assembly includes a coupling member that has an elongated top portion that has a first end and a second end. The coupling member also has a clamp support portion that extends from the second end of the top portion in a direction substantially normal to an elongated direction of the top portion such that the coupling member has a substantial "L" shape. The clamp assembly also includes a clamp member that has a base that is coupled to the clamp support portion. The clamp member also has a first clamp portion that has a first end fixed to the base, and a second end that is free. The first clamp portion has a semicircular shape between its first end and its second end. The clamp member also has a second clamp portion including a first end that is joined to the first end of the first clamp portion by a hinge. The second clamp portion has a semicircular shape between its first end and its second end. The semicircular shape of the second clamp portion opposes the semicircular shape of the first clamp portion such that the first and second clamp portions define a circle between them when the second ends of the upper and second clamp portions are bought together. The clamp assembly also has a latch mechanism mounted at the second end of the first clamp portion that is moveable and configured to latch the second end of the second clamp portion to the second end of the first clamp portion.

Some exemplary embodiments of the inventive disclosure provide an electronic device mountable to a support structure. The small cell access node device includes a turn-lock electrical connector disposed on a bottom side at a front of the small cell access node device. The small cell access node device also has a pair of parallel tracks along the bottom side, each one of the pair of tracks runs in a direction from a back to the front of the small cell access node device and each have a slot along the track in which to receive a corresponding shuttle. The small cell access node device has a clamp assembly that includes a coupling member. The coupling member has an elongated top portion with a first end and a second end. The coupling member further includes a clamp support portion that extends from the second end of the top portion in a direction substantially normal to an elongated direction of the top portion. The coupling member also includes a first shuttle at first end disposed on a top surface of the top portion and coupled into a first one of the pair of tracks, and a second shuttle at second end disposed on the top surface of the top portion and coupled into a second one of the pair of tracks. The shuttles are movable along the tracks and hold the clamp assembly to the bottom side of the small cell access node device. The clamp assembly of the small cell access node device further includes a clamp member that has a base, and the base is coupled to the clamp support portion of the coupling member. The clamp member further has a first clamp portion having a first end fixed to the base and a second end that is positioned closer to the top portion of the coupling member than the first end. The clamp member also has a second clamp portion that has a first end that is coupled to the first end of the first clamp portion by a hinge joint such that the second clamp portion is moveable about the hinge joint. The second clamp portion also has a second end that mates against the second end of the first clamp portion when the second clamp portion is in a closed position. The clamp assembly further includes a latch that is anchored at the second end of the first clamp portion, and that is configured to engage the second end of the lower clamp member when the lower clamp member is in the closed position.

Some other exemplary embodiments of the present disclosure provide a clamp assembly for mounting on a pole section of a lighting structure that includes a coupling member having a top portion. The top portion has a first end, a second end, and a top surface. The coupling member also has a clamp support portion that extends from the top portion at the second end of the top portion, opposite the top surface, at substantially a right angle to the top portion. The clamp assembly further includes a clamp member that has a base that is slidably coupled to the clamp support portion. The clamp member has a first clamp portion having a first end which is fixed to the base, and a second end that is closer to the top portion of the coupling member than the first end of the first clamp portion is to the top portion. The first clamp portion has a semi-circular inner face between the first and second ends of the first clamp portion. The clamp member further has a second clamp portion that has a first end connected to the first end of the first clamp portion at a hinge joint. The second clamp portion is movable about the hinge joint between an open and a closed position. In the closed position a second end of the second clamp portion is against the second end of the first clamp portion. The second clamp portion has a semi-circular inner face between the first and second ends of the second clamp portion. The clamp assembly further has a latch member with a first end anchored at a hinge joint at the second end of the first clamp portion. The latch member is movable about the hinge joint between an unlatched position and a latched position, and is configured to latch the second end of the second clamp portion against the second end of the first clamp portion.

Although the present disclosure illustrates and describes a clamp assembly for mounting a small cell access node device on an outdoor light fixture, it is, nevertheless, not intended to be limited to the details shown because various modifications and structural changes may be made therein without departing from the spirit of the disclosure and while remaining within the scope and range of equivalents of the claims. Additionally, well-known elements of the invention will not be described in detail or will be omitted so as not to obscure the relevant details of the invention.

Features that are considered characteristic of the invention are set forth in the appended claims. As required, detailed embodiments of the small cell housing are disclosed herein; however, it is to be understood that the disclosed embodiments are merely exemplary, and the housing may be embodied in various forms. Therefore, specific structural and functional details disclosed herein are not to be interpreted as limiting, but merely as a basis for the claims and as a representative basis for teaching one of ordinary skill in the art to variously employ the claimed invention in appropriately detailed structures. Further, the terms and phrases used herein are not intended to be limiting; but rather, to provide an understandable description of the disclosure. While the specification concludes with claims defining the features of the invention, it is believed that the claimed invention will be better understood from a consideration of the following description in conjunction with the drawing figures, in which like reference numerals are carried forward. The figures of the drawings are not drawn to scale.

The terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time.

As used in this description, unless otherwise specified, azimuth or positional relationships indicated by terms such as "up", "down", "left", "right", "inside", "outside", "front", "back", "head", "tail" and so on, are azimuth or positional relationships based on the drawings, which are only to facilitate description of the embodiments of the present invention and simplify the description, but not to indicate or imply that the devices or components must have a specific azimuth, or be constructed or operated in the specific azimuth, which thus cannot be understood as a limitation to the embodiments of the present invention. Furthermore, terms such as "first", "second," "third," and so on are only used for descriptive purposes and should not be construed as indicating or implying relative importance.

As used in this description, unless otherwise clearly defined and limited, terms such as "installed", "coupled", "connected" should be broadly interpreted, for example, it may be fixedly connected, or may be detachably connected, or integrally connected; it may be mechanically connected, or may be electrically connected; it may be directly connected or may be indirectly connected via an intermediate medium. As used herein, the terms "about" or "approximately" apply to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. In this document, the term "longitudinal" should be understood to mean in a direction corresponding to an elongated direction of the device. Those skilled in the art can understand the specific meanings of the above-mentioned terms in the embodiments of the present disclosure according to the specific circumstances.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present disclosure.

DETAILED DESCRIPTION

Figure 1:
FIG. 1 is a front elevational view of a clamp assembly with its clamp member in an open position, in accordance with an exemplary embodiment of the present disclosure.
Figure 2:
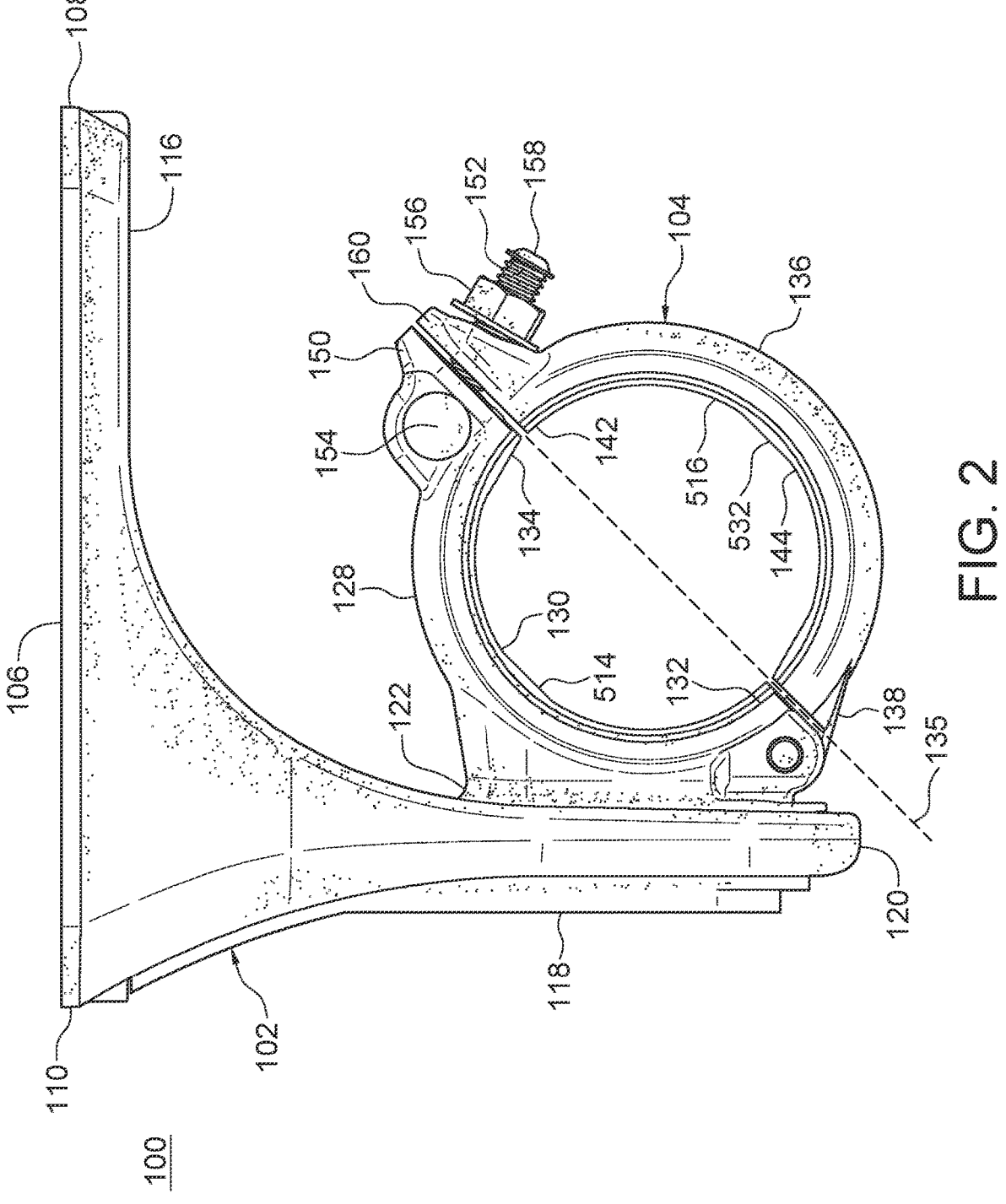
FIG. 2 is a front elevational view of the clamp assembly of FIG. 1 with the clamp member in a closed position, in accordance with an exemplary embodiment of the present disclosure.
Figure 3:
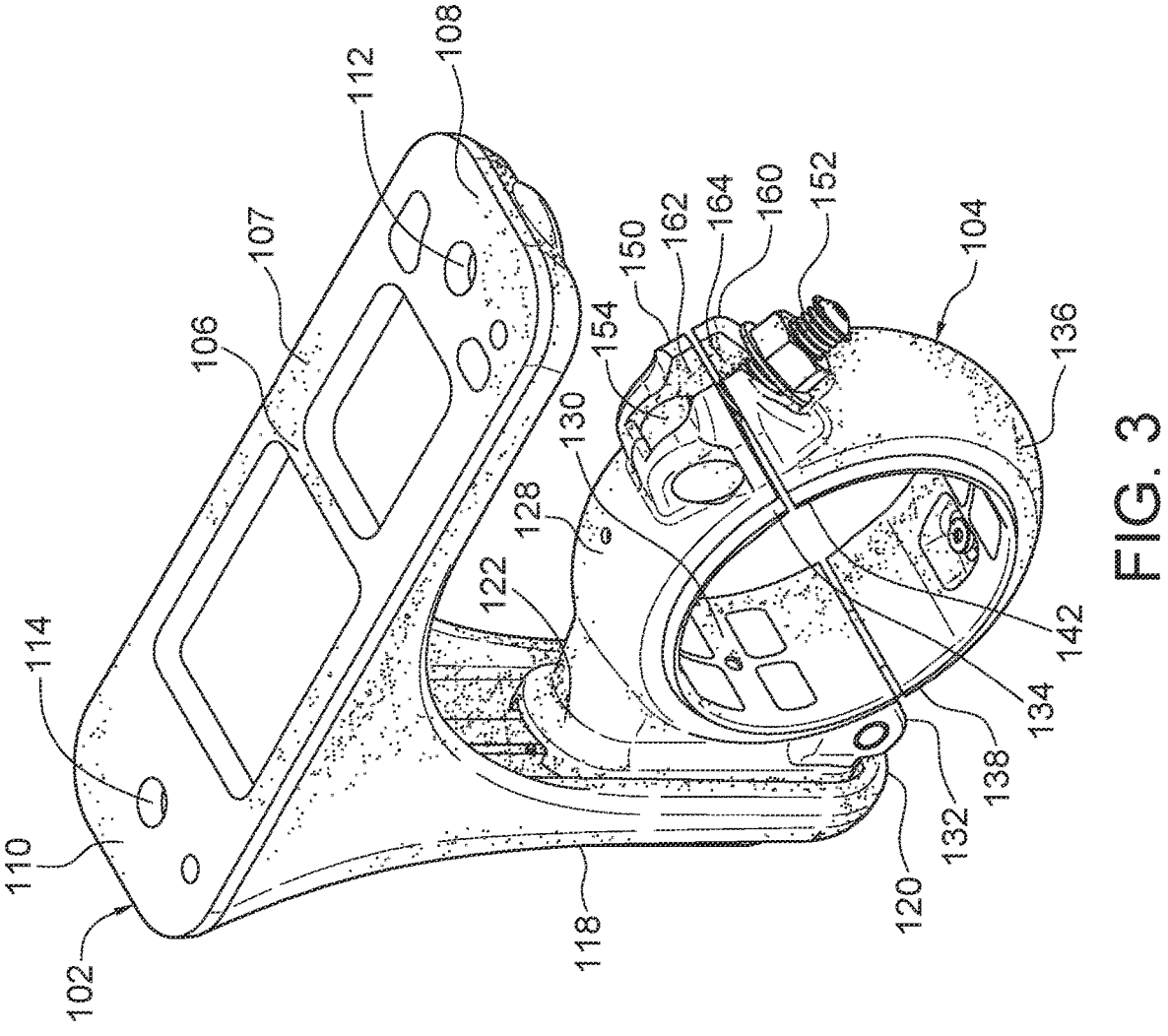
FIG. 3 is a perspective view of the clamp assembly of FIG. 1 with the clamp member in the closed position, in accordance with an exemplary embodiment of the present disclosure.
Figure 4:
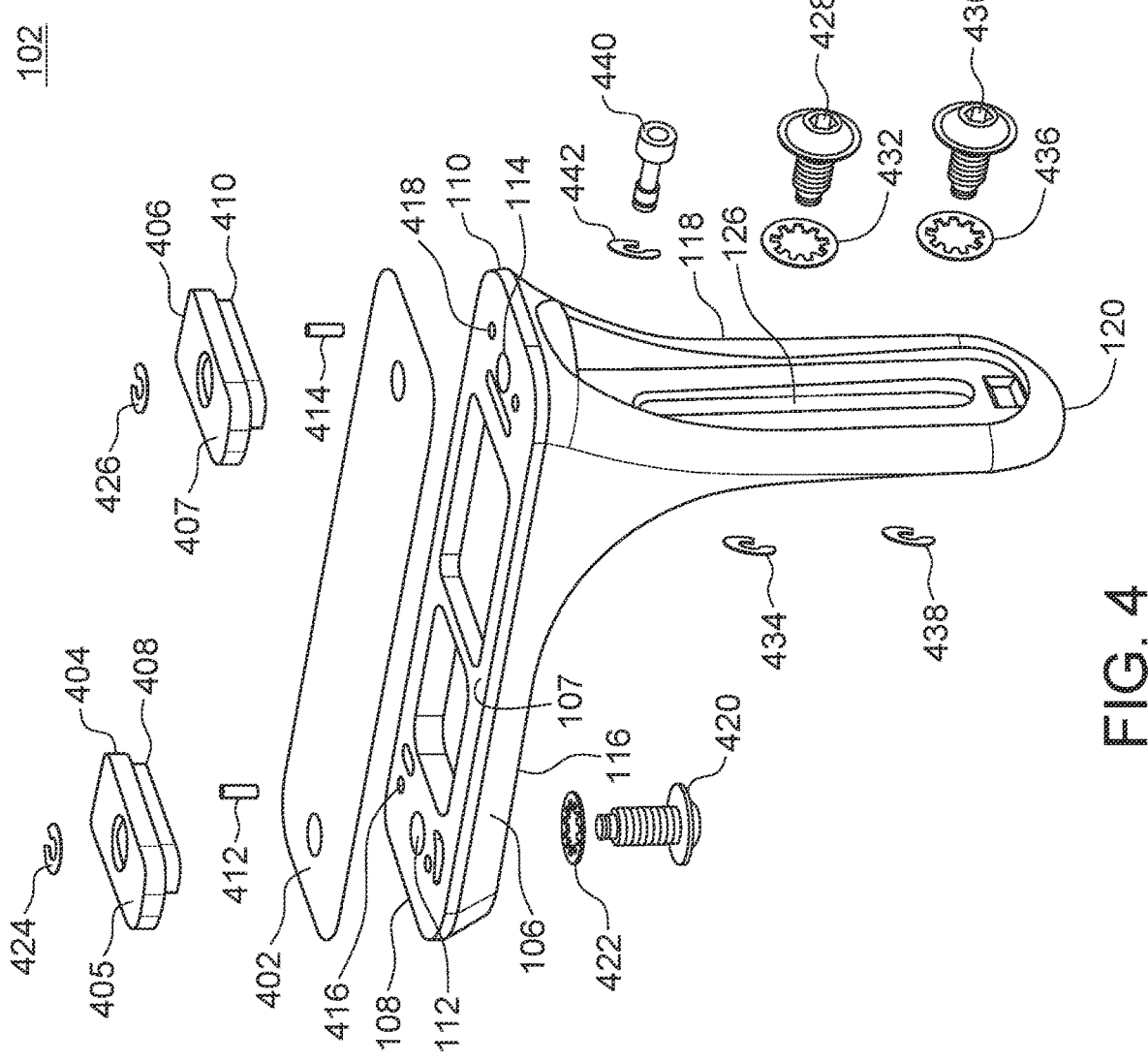
FIG. 4 is an exploded view of a coupling member of the clamp assembly of FIG. 1, in accordance with an additional exemplary embodiment of the present disclosure.
Figure 5:
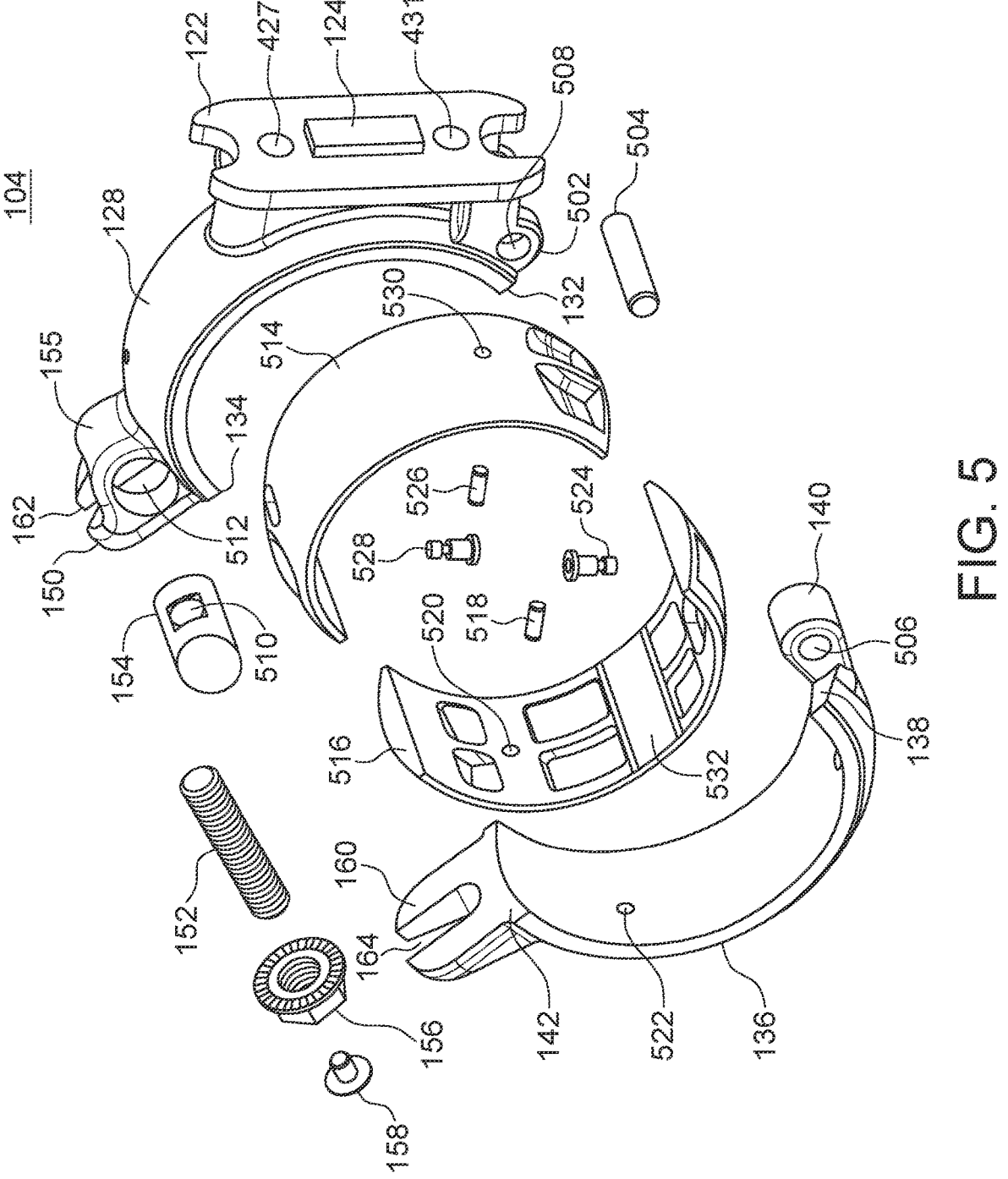
FIG. 5 is an exploded view of a clamp member of the clamp assembly of FIG. 1, in accordance with a further exemplary embodiment of the present disclosure.

FIG. 1 is a front elevational view of a clamp assembly with its clamp member in an open position, in accordance with an exemplary embodiment of the present disclosure. The clamp assembly 100 includes a coupling member 102 and a clamp member 104. The coupling member 102 couples the clamp assembly 100 to the bottom of an electronic device, such as an aerially-mountable small cell access node or other electronic device, and the clamp member 104 is configured to encircle or surround, and clamp to, a support structure, such as pole of a streetlight. FIGS. 2 and 3 show alternative views of the clamp assembly 100 with the clamp member 104 closed as it would be when clamped to a pole section of a lighting fixture. FIG. 4 shows an exploded sub-assembly view of the coupling member 102, and FIG. 5 shows and exploded sub-assembly view of the clamp member 104. Some of the features referenced herein may be viewable in one or more of FIGS. 1-5 but not necessarily all of the drawings.

The coupling member 102 includes an electronic device support portion 106 having a generally flat, top surface 107. The electronic device support portion 106 has a first end 108 and a second end 110 opposite the first end 108. The first and second ends 108, 110 generally have a width in a direction normal to a direction from the first end 108 to the second end 110, and the widths of the first and second ends 108, 110 are substantially less than a length between the first and second ends 108, 110. As a result, the top surface 107 can be generally rectangular, but can also be elliptical or oval or have another shape. In some applications the top portion 106 is oriented to be generally horizontal with the top surface 107 being generally flat. The electronic device support portion 106 at the first end 108, has a bottom 116 that may be generally flat and parallel to the top surface 107 along some of the electronic device support portion 106 from the first end 108 toward the second end 110. A first opening 112 at the first end passes through the electronic device support portion 106, from the top surface 107 to the bottom 116. Likewise, a second opening 114 at the second end 110 passes through the electronic device support portion 106 as well. The first and second openings 112, 114 allow fasteners to pass through the electronic device support portion 106 to facilitate attachment to the bottom of an electronic device.

A clamp support portion 118 extends from the electronic device support portion 106 at a generally right angle to the elongated direction of the electronic device support portion 106 (i.e., the direction between the ends 108, 110). In particular, the clamp support portion 118 extends from the electronic device support portion 106 opposite the top surface 107 near the second end 110, and is off center, relative to the first and second ends 108, 110 of the electronic device support portion 106. The clamp support portion 118 may depend from or be attached to the electronic device support portion 106. The clamp support portion 118 has a distal end or bottom 120 that terminates the clamp support portion 118, and the clamp support portion 118 is configured to couple to the clamp member 104 and support the clamp member 104. Thus, when the clamp member 104 is clamped to a pole section of a light fixture, the electronic device support portion 106 can be coupled to the bottom of the electronic device, and the clamp assembly 100 acts to secure the electronic device to the support structure (e.g., a pole section of a streetlight).

The clamp member 104 includes a base portion 122 and two pivotally or hingeably coupled clamp portions 128, 136. The base portion 122 includes a protrusion 124 (shown in an exemplary rectangular shape in FIG. 5) along its side opposite the side to which the base portion is coupled to a clamp portion 128, which may be a first clamp portion. The protrusion is configured to fit within a corresponding recess, slot, or channel 126 in the clamp support portion 118. In one exemplary embodiment, the protrusion 24 is shorter than the length of its corresponding channel 126 in the clamp support portion 118 to allow the base portion 122 to be height-adjustable relative to the top portion 106. The channel 126 may be implemented using a slotted opening in the clamp support portion 118, which runs in an elongated direction of the clamp support portion 118 and is longer than the base portion protrusion 124 to allow the position of the clamp member 104 to be adjusted relative to the top portion 106 of the coupling member 102. That is, the base portion 122 can slide along the clamp support portion 118 in some embodiments and be fixed at a desired position to allow leveling of an electronic device secured to the couple member 102 by adjusting the distance between the top portion 106 of the coupling member 102 and the clamp member 104. The base portion 122 is joined to the first clamp portion 128 that defines an arched (e.g., semi-circular) engagement surface 130, which may include a first bushing component 514 or may accommodate attachment of a first bushing component 514. The first bushing component 514 may be made of metal, such as aluminum, or any other material having a high coefficient of friction and being slightly compressible or resilient. The first clamp portion 128 has a first end 132 that is proximate to the bottom or lower end of the base portion 122. From the first end 132, the first clamp portion 128 follows an arched path to a second end 134. The second end 134 of the first clamp portion 128 is closer to the top portion 106 of the coupling member 102 than is the first end 132 of the first clamp portion 128. As such, a line 135 from the first end 132 to the second end 134 of the first clamp portion 128 may be at about a forty-five degree angle to either the elongated direction of the top portion 106 of the coupling member 102 or the elongated direction of the clamp support portion 118, since they are at a generally right angle to each other. As a result, the clamp assembly 100 only needs to be moved or slid a small distance, as indicated by dashed line 202, in order to pass over a support structure, such as a section of a pole, as compared to line 204 if the first ends 132, 140 of the clamp portions 128, 136 were at the same height as their respective second ends 134, 142.

The second clamp portion 136, which may be positioned lower than the first clamp portion 128 during use of the clamp assembly 100, is likewise arched and may include or accommodate attachment of a second bushing component 516. The second bushing component 516 may be made of metal, such as aluminum, or any other material having a high coefficient of friction and optionally being slightly compressible or resilient. The material used and the geometric shape selected for implementing the bushing components 514, 516 should be sufficient to resist movement or rotation of the clamp member 104 relative to the support structure to which the clamp member 104 is secured. The second clamp portion 136 has a first end 138 that is proximate the first end 132 of the first clamp portion 128 and is hingeably joined to the first clamp portion 128 by an interleaving member 140 that extends from the first end 138 of the second clamp portion 136 between one or more extensions 502, which extend from the first end 132 of the first clamp portion 128. A hinge pin 504 may be included to pass through lateral openings 506 and 508 of the interleaving member 140 and the extension(s) 502, respectively. Thus, the second clamp portion 136 is moveable relative to the first clamp portion 128 to open and close the clamp member 104. In the closed position the second end 142 of the second clamp portion 136 will be against the second end 134 of the upper clamp portion 128. The second clamp portion 136 is movable, about the hinge pin 504, relative to the first clamp portion 128, between a closed position as shown in FIG. 2, and an open position. FIG. 1 shows the second clamp portion 136 in a partially open position, and it can be opened further to allow a light fixture pole to fit within the clamp member 104, and then closed to clamp the clamp member 104 on the pole. Thus, the second clamp portion 136 is moveable between an open position, such as that shown in FIG. 1, and which can be opened further than that shown. In particular, the lower clamp member 136 is movable such that a distance between the second ends 134, 142 is larger than the diameter of the circle defined between the first and second clamp portions when the second clamp portion is closed, as shown in FIG. 2, with the second end 134, 142 against each other. As shown in FIGS. 1-3 and 6-8, the clamp portions 128, 136, the hinge, and the latch of the clamp member 104 are positioned under the electronic device support portion 106 of the coupling member 102.

To hold the lower clamp member 136 in the closed position, a latch is provided that includes a threaded rod 152 that is anchored at one end in a transverse cylinder 154, which has a threaded opening 510 through the cylinder 154 to receive the threaded end of the threaded rod 152. The cylinder 154 is held by a boss 155 at the second end 134 of the first clamp portion 128 to form a hinge joint at the second 134 of the first clamp portion. The hinge joint allows the threaded rod 152, acting as a latch member, to rotate about the hinge joint, meaning the free end or latching end of the threaded rod 152 can rotate around the hinge joint location. The boss 155 has a corresponding transverse hole 512 in which the cylinder sits, allowing the cylinder to rotate in place. The boss 155 includes a slot 162 along its top to allow the threaded rod 152 to rotate about the transverse axis of the cylinder 154. The boss 155 is adjacent to an outward extension 150 at the second end 134 through with the slot 162 passes. The second clamp portion 136, at its second end 142, includes an outward or radial extension 150 that abuts the radial extension 150 of the first clamp portion 128 when the lower claim portion 136 is in the closed position (e.g., as illustrated in FIG. 2). The slot 164 of the radial extension 150 of the second clamp portion 136 aligns with the slot 162 of the radial extension 150 of the first clamp portion 128. As a result, the threaded rod 152 can be positioned in an extended position as shown in FIG. 1, when the second clamp portion 136 is in an open position, and then rotated to a latch position as shown in FIGS. 2-3 to latch the second clamp portion 136 in the closed position. A latch nut 156 disposed on the threaded rod 152 is retained on the threaded rod 152, which is tightened against the backside of the radial extension 160 to retain the second clamp portion 136 in the closed position. A retaining cap 158 can be placed at the distal end of the threaded rod 152 to prevent the latch nut 156 from coming off that the threaded rod 152.

In FIG. 4, additional features of the coupling member 102 are shown, in accordance with some alternative embodiments. For example, a non-conductive spacer 402 can be placed over the top surface 107 of the top portion 106 of the coupling member 102 to provide electrical isolation between the top surface 107 of the top portion 106 of the coupling member 102 and a pair of shuttles 404, 406 that support an electronic device mounted to the top portion 106 of the coupling member 102. The pair of shuttles 404, 406 may be disposed at the first end 108 and second end 110, respectively, of the top portion 106. The shuttles sit on top of the top portion 106, over the top surface 107, and have an outward extending top portion 405, 407 over a connecting portion 408, 410, respectively. The outward extending portions fit into captured rails in the bottom of the small cell access node device. Pins 412, 414 sit partly in the connecting portions 408, 410, and partly in the top portion 106 at the top surface 107 to prevent the shuttles 404, 406 from turning. A threaded fastener 420 can pass through opening 112 at the first end 108 of the top portion to retain shuttle 404. A washer 422 can be disposed on the threaded shank of the threaded fastener 420 at the bottom of the top portion 106, while a C clip 424 is used on the distal end of the threaded shank to retain the shuttle 404 on the threaded shank of the threaded fastener 420. Another threaded fastener 420 can be used to retain shuttle 406, passing through opening 114 at the second end 110 of the top portion 106 of the coupling member 104.

To hold the clamp member 104 to the coupling member 102 threaded fasteners 428, 430 pass through slot 126 into holes 427, 431 on base 122 of the clamp member 102 (see FIG. 5). Washers 432, 436, and C clips 434, 438 can be used to retain the threaded fasteners 428, 430 in place, once adjusted. The threaded fasteners 428, 430 can be loosened to allow the base 122 of the clamp member 104 to move vertically along the clamp support portion 118 to an optimum position and then the threaded fasteners 428, 430 can be tightened to hold the clamp member 104 in place. A clamp cover screw 440 can be used to hold a cover (not shown) over the threaded fasteners 428, 430 and the exterior side of the clamp support portion 118. A retaining clip 442 can be used to retain the clamp cover screw 440.

FIG. 5 is an exploded view of the exemplary clamp member 104 of the clamp assembly 100, in accordance with exemplary embodiments of the present disclosure. In FIG. 5, the bushing components 514, 516 are secured in their respective clamp portions 128, 136. The first and second bushing components 514, 516 can be selected to fit the clamp onto a variety of sizes and shapes of support structures, such as light poles. That is, light poles are generally cylindrical or have a rounded rectangular shape but may vary in diameter. To obtain a proper clamp force on the pole section, the characteristics, such as shape and thickness, of the bushing components 514, 516 may be selected for an optimum fit. That is, the bushing components 514, 516, when together (i.e., when the clamp is closed), will form a hoop, ring, rounded rectangle or other desired shape around the support structure, such that the bushing formed by the bushing components 514, 516 has an inner diameter or other inner dimension that is about equal to the outer diameter or dimension of the support structure, and has an outer diameter or other dimension that is the same size as the diameter or dimension of the opening formed be the first and second clamp portions 128, 136 (without the bushing components 514, 516). In some embodiments, the bushing components 514, 516 can be made of aluminum and are aligned and secured in their respective clamp portions 128, 136. For example, second bushing component 516 has an alignment hole 520 that aligns with a corresponding alignment hole 522 in the inner face of the second clamp portion 136. A pin 518 extends through both of the alignment holes 520, 522 to align the bushing component 516 against the inner face of the second clamp portion 136. A clamp insert bolt 524 also passes through the bushing component 516 and into the clamp portion to secure the bushing component 516 to the second clamp portion 136. Similarly, alignment pin 526 passes through alignment hole 530 in the first bushing component 514, which is further secured to the first clamp portion by clamp insert bolt 528 which screws into a threaded hole in the first clamp portion and passes through the first bushing component 514. To further secure the clamp to the light pole, the bushing components 514, 516, which generally providing a circular inner diameter or shape, can have one or more flat facets 532 which can further ensure secure clamping in view of the tolerance range of light pole diameters.

Figure 6:
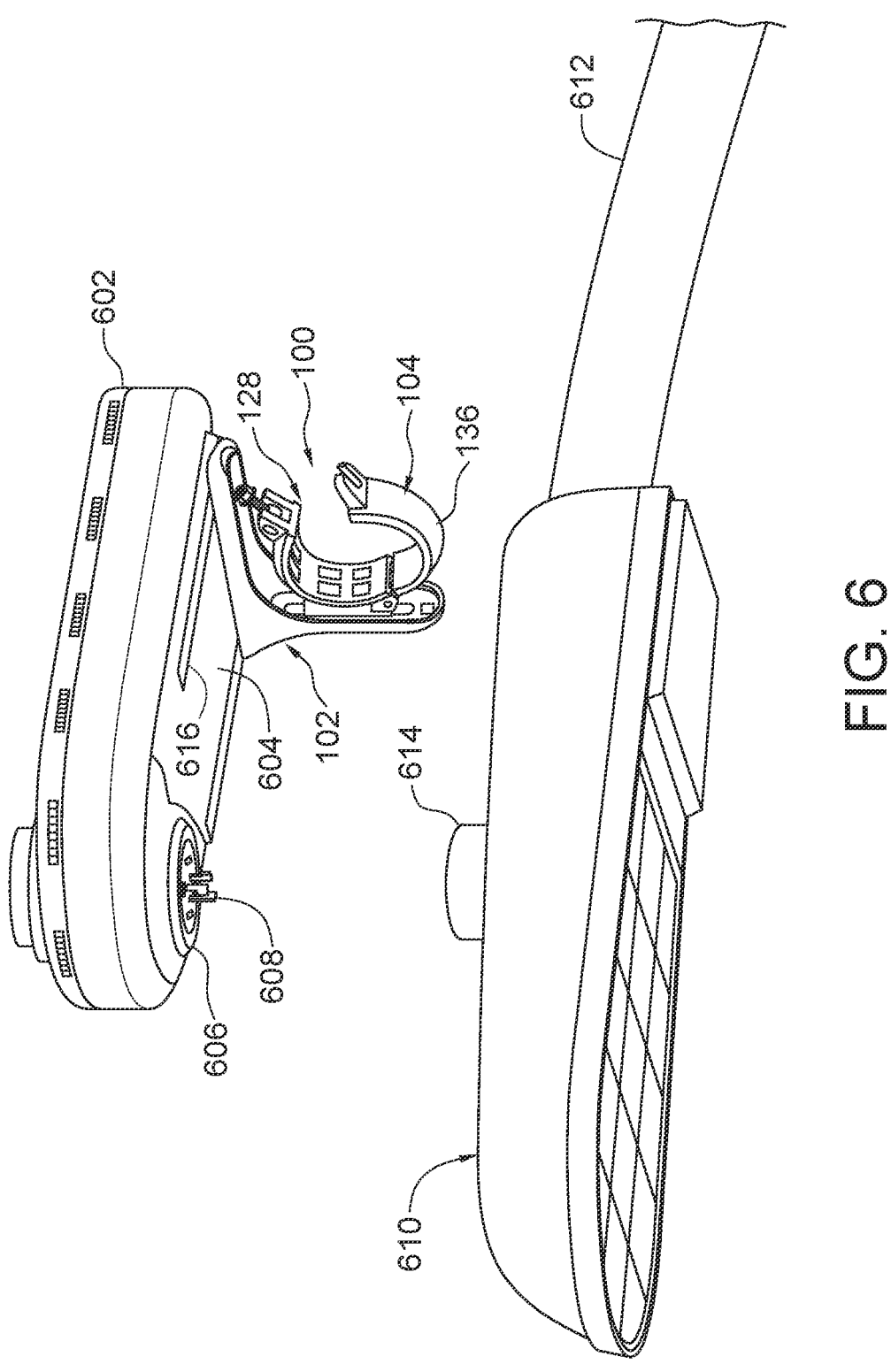
FIG. 6 shows an exemplary electronic device that includes the clamp assembly of FIG. 1 in a position prior to securing the electronic device to a streetlight, in accordance with some exemplary embodiments of the present disclosure.
Figure 7:
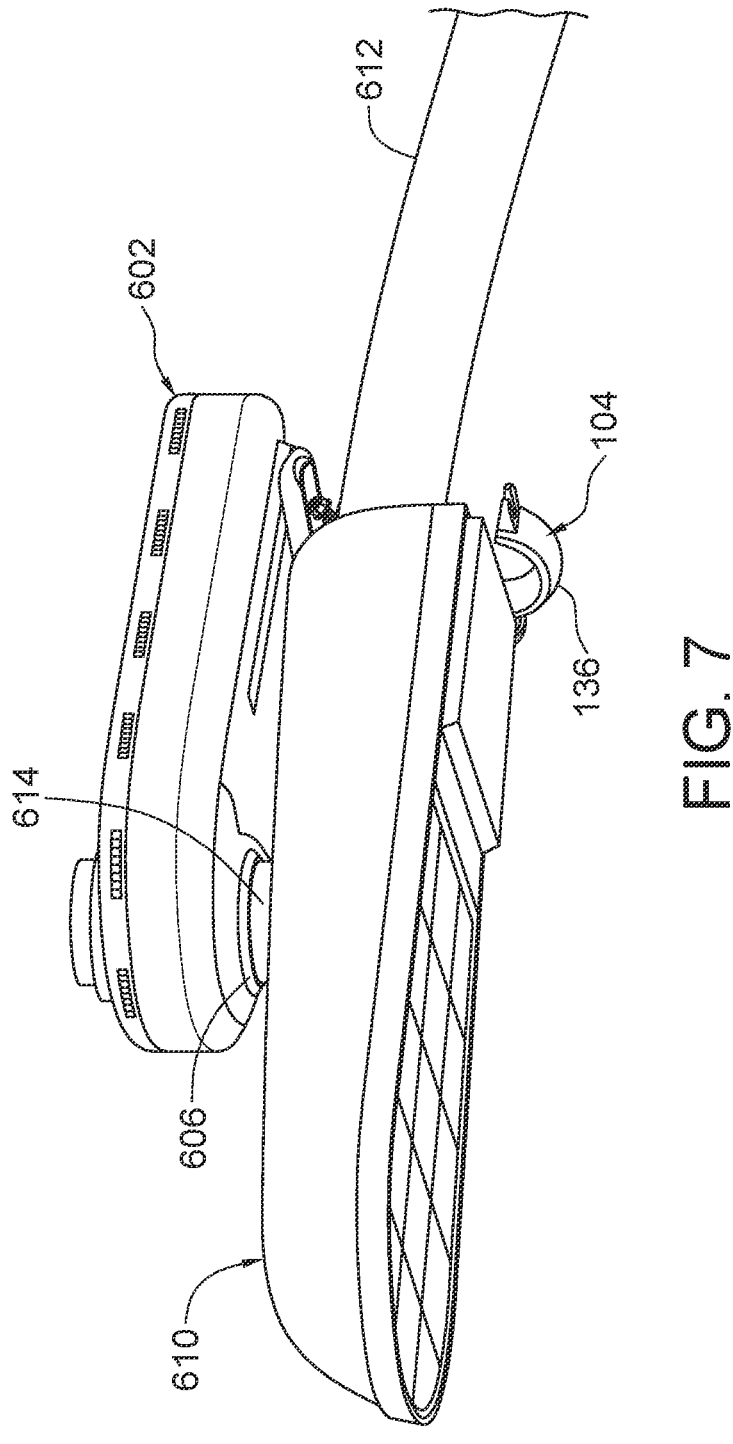
FIG. 7 shows the exemplary electronic device of FIG. 6 as connected to a light fixture of the streetlight with the clamp assembly open and positioned around a section of a light pole, in accordance with some exemplary embodiments of the present disclosure.
Figure 8:
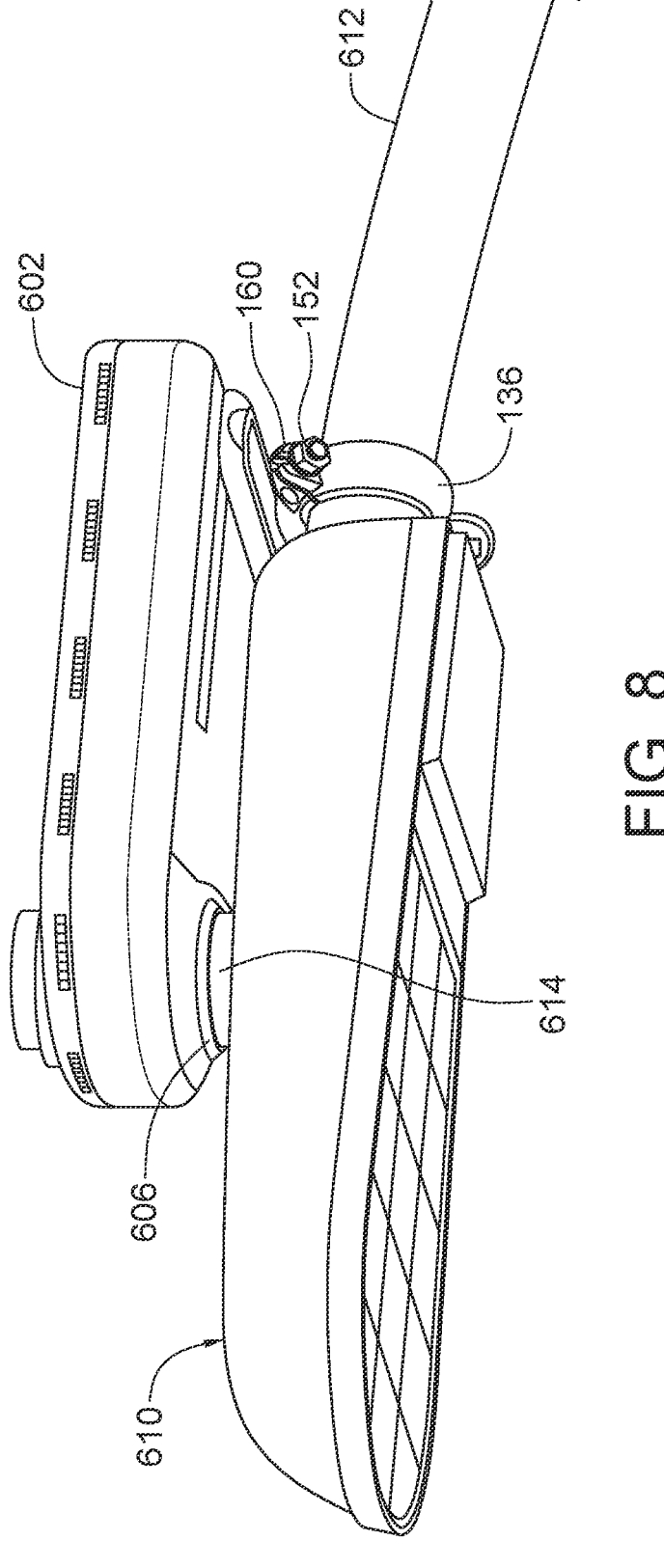
FIG. 8 shows the exemplary electronic device of FIG. 6 secured to the streetlight with the clamp closed, in accordance with some embodiments of the present disclosure.

FIGS. 6-8 shows an electronic device, such as, but not limited to, a small cell access node device, using a clamp assembly 100 being installed on a streetlight, in sequence. FIG. 6 shows the clamp assembly 100 open, and prior to connecting the electronic device 602 to the streetlight; FIG. 7 shows the electronic device 602 connected to a light fixture of the streetlight but with the clamp assembly 100 still open; and FIG. 8 shows the electronic device 602 connected to the streetlight and with the clamp assembly 100 closed. The electronic device 602 may be a wireless telecommunications device that provides a local cell of communication access for nearby mobile devices and connects to a telecommunications network for both voice and data communications. For example, the electronic device 602 may provide a wireless air interface in accordance with the standard known as "5G," which supports a fifth generation of mobile wireless communication. According to one exemplary embodiment, the streetlight may have a substantially vertical pole section 612 that is terminated by a light fixture 610. The light fixture 610 may include an electrical connector 614 on its top side. The pole section 612 can be mounted to a building, or joined to a vertical pole section that is erected from a ground base.

According to one exemplary embodiment, the electronic device 602 may include, on its bottom side, an electrical connector site 606 that has turn-lock prongs 608 that mate with corresponding electrical connector features in the connector 614 of the light fixture 610. In general, the connector 614 and mating connector site 606 are configured to come together vertically such that the prongs 608 enter receptacles in the connector 614, and then the electronic device 602 is rotated about the connector in a plane normal to the vertical direction to lock the prongs 608 in place. In some embodiments, the connector 614 can be a socket as specified by the National Electrical Manufacturers Association (NEMA) in accordance with standard C136.4 or C136.55 of the American National Standard Institute (ANSI). Thus, in FIG. 6, the clamp assembly 100 is shown in an exemplary manner, above the pole section 612, but also to the side, while connection site 606 is directly over and vertically aligned with connector 614 so that prongs 608 will properly engage with mating electrical connector features in the connector 614 as shown in FIG. 7.

The clamp assembly 100 is mounted on the bottom 604 of the electronic device 602. On the bottom 604 of the electronic device 602 there are two parallel tracks 616 that are configured to receive therein the top portion 405, 407 of the shuttles 404, 406 while the connecting portions 408, 410 of the shuttles 404, 406 pass through a slot along each track 616. The shuttles 404, 406 can move along the track 6161, which allows the coupling member 102 of the clamp assembly 100 (and therefore the clamp assembly 100 itself) to be positioned at an optimum or desired point along the tracks

616. In FIG. 6, with the electronic device 602 positioned over the light fixture, and turned such that, while the connection site 606 is directly over the connector 614, the back end of the electronic device 602 and the clamp assembly 100 are offset to the side of the pole section 612. Further, the second clamp portion 136 of the clamp member 104 is open, substantially as shown in FIG. 1 so that the pole section can fit between the upper and lower claim portion 128, 136. Accordingly, from the position shown in FIG. 6, the electronic device 602 is lowered such the electrical connection at connection site 606 and the connector 614 on the lamp 610 is made, and then the electronic device 602 is rotated to lock the prong 608 into the connector 614, and at the same time, move the first clamp portion 128 over the pole section 612, and the second clamp portion 136 under the pole section 612 to the position shown in FIG. 7. In the position shown in FIG. 7, electrical power is provided to the electronic device 602 from the lamp 610 through connector 614. The locking aspect of the prongs 608 and connector 614 provide a mechanical lock prevents the front end of the electronic device 602 from separating away from the lamp 610. To complete the mounting of the electronic device 602 onto the light fixture, the second clamp portion 136 is raised to close the clamp member 104, and the threaded rod 152 is moved so that the latch nut 156 can be tightened against radial extension 160 to close the clamp portion 128, 136 together, such that the clamp assembly is substantially in the state shown in FIG. 2. The position of the clamp member 104 in the coupling member 102 can then be adjusted to level the electronic device 602. With the clamp assembly 100 clamped onto the pole section 612, the electronic device 602 can then be levelled and is then ready for operation.

The clamp assembly 100 therefore provides the benefit of being able to adjust the position of the clamp assembly 100 relative to the electronic device 602, and to adjust the position of the clamp member on the coupling member to be able to level the electronic device 602. The configuration of the first and second clamp portions 128, 136 allows for single handed closure of the clamp; an installer can lift the second clamp portion 136 to close the clamp portions 128, 136 together with the fingers of one hand and while holding the second clamp portion in the closed position, use their thumb to move the threaded rod 152 into the latch position, and the tighten the latch nut 156 with their thumb as well. One the latch nut is "thumb tight," the installer can let go of the lower clamp member 136 and use a tool (wrench) to tighten the latch nut 156 to a desired torque. Thus, the inventive clamp assembly 100 allows for simple mounting, including levelling, of the small cell access node device onto a light fixture. By positioning the first clamp portion with the first end lower than the second (free) end, the height that the small cell access node device needs to be lifted for the second end of the first clamp portion to pass over the pole section is reduced, which puts less torque and stress on the electrical connectors when mounting the small cell access node device.

The claims appended hereto are meant to cover all modifications and changes within the scope and spirit of the present disclosure.

What is claimed is:

1. An electronic device mountable to a support structure, the electronic device comprising:

a housing having a top side and a bottom side, wherein the bottom side includes two parallel shuttle tracks extending along a longitudinal direction thereof;

a coupling member including an elongated electronic device support portion and a clamp support portion, the electronic device support portion having a first end and a second end, the clamp support portion extending from near the second end of the electronic device support portion at a generally right angle to an elongated direction of the electronic device support portion;

a clamp member including a base, a first arched clamp portion, a second arched clamp portion, and a hinge, the base being slidably coupled to the clamp support portion of the coupling member, the first clamp portion being attached to the base and oriented such that a second end of the first clamp portion is closer to the electronic device support portion of the coupling member than is a first end of the first clamp portion, the hinge pivotally coupling a first end of the second clamp portion to the first end of the first clamp portion such that an arch shape of the second clamp portion is positioned opposite an arch shape of the first clamp portion when the clamp member is closed;

a latch mechanism positioned at the second end of the first clamp portion and the second end of the second clamp portion, the latch mechanism configured to latch the second end of the first clamp portion to the second end of the second clamp portion after the first clamp portion and the second clamp portion are positioned about the support structure;

a first shuttle positioned proximate a first surface of the electronic device support portion at a first position along the elongated direction of the electronic device support portion; and a second shuttle positioned proximate the first surface of the electronic device support portion at a second position along the elongated direction of the electronic device support portion, wherein the first shuttle and the second shuttle fit into the two parallel shuttle tracks of the housing.

2. The electronic device of claim 1, wherein the clamp member further includes:

a first bushing component attached to an inner face of the first clamp portion; and a second bushing component attached to an inner face of the second clamp portion.

3. The electronic device of claim 2, wherein the first bushing component and the second bushing component each have at least one flat facet.

4. The electronic device apparatus of claim 1, wherein the electronic device support portion of the coupling member further includes:

a non-conductive spacer positioned between the first and second shuttles and the first surface of the electronic device support portion.

5. The electronic device of claim 1, wherein the first clamp portion is attached to the base such that the first end of the first clamp portion and the second end of the first clamp portion are oriented along an axis forming an approximately forty-five degree angle relative to the clamp support portion of the coupling member.

6. The electronic device of claim 1, wherein the clamp support portion of the coupling member is configured to allow a position of the clamp member to be adjusted relative to a position of the electronic device support portion of the coupling member.

7. The electronic device of claim 6, wherein the clamp support portion of the coupling member defines a channel along a length thereof and wherein the base of the clamp member includes a protrusion that fits into the channel.

8. The electronic device of claim 7, further comprising:

one or more threaded fasteners passing through the channel of the clamp support portion of the coupling member and into the base of the clamp member from an opposite side of the clamp support portion to secure the base to the clamp support portion.

9. The electronic device of claim 1, wherein the second clamp portion of the clamp member has an outward radial extension at the second end thereof, the outward radial extension defining a slot, and wherein the latch mechanism includes:

a threaded rod having a first end and a second end, the first end of the threaded rod being coupled to the second end of the first clamp portion of the clamp member at a hinge joint; and a latch nut disposed on the threaded rod so as to be on an outer side of the outward radial extension when the threaded rod is rotated about the hinge joint and positioned in the slot of the outward radial extension to permit tightening of the latch nut against the outer side of the outward radial extension.

10. An electronic device mountable to a support structure, the electronic device comprising:

a housing having a top side and a bottom side, wherein the bottom side includes two parallel shuttle tracks extending along a longitudinal direction thereof;

a coupling member including an elongated electronic device support portion and a clamp support portion, the clamp support portion extending from near one end of the electronic device support portion at a generally right angle to an elongated direction of the electronic device support portion;

a clamp member including a base, a first clamp portion, a second clamp portion, and a hinge, the base being slidably coupled to the clamp support portion of the coupling member, the first clamp portion being attached to the base and oriented such that a second end of the first clamp portion is closer to the electronic device support portion of the coupling member than is a first end of the first clamp portion, the hinge pivotally coupling a first end of the second clamp portion to the first end of the first clamp portion such that the second clamp portion is positioned opposite the first clamp portion when the clamp member is closed;

a latch mechanism positioned at a second end of the first clamp portion and a second end of the second clamp portion, the latch mechanism configured to latch the second end of the first clamp portion to the second end of the second clamp portion after the first clamp portion and the second clamp portion are positioned about the support structure;

a first shuttle positioned proximate a first surface of the electronic device support portion at a first position along the elongated direction of the electronic device support portion; and a second shuttle positioned proximate the first surface of the electronic device support portion at a second position along the elongated direction of the electronic device support portion, wherein the first shuttle and the second shuttle fit into the two parallel shuttle tracks of the housing.

11. The electronic device of claim 10, wherein the clamp member further includes:

a first bushing component attached to an inner face of the first clamp portion; and a second bushing component attached to an inner face of the second clamp portion.

12. The electronic device of claim 11, wherein the first bushing component and the second bushing component each have at least one flat facet.

13. The electronic device of claim 10, wherein the electronic device support portion of the coupling member further includes:

a non-conductive spacer positioned between the first and second shuttles and the first surface of the electronic device support portion.

14. The electronic device of claim 10, wherein the clamp support portion of the coupling member is configured to allow a position of the clamp member to be adjusted relative to a position of the electronic device support portion of the coupling member.

15. An electronic device mountable to a support structure, the electronic device comprising:

a housing having a top side and a bottom side, wherein the bottom side includes two parallel shuttle tracks extending along a longitudinal direction thereof;

a coupling member including an elongated electronic device support portion and a clamp support portion, the clamp support portion extending from near one end of the electronic device support portion at a generally right angle to an elongated direction of the electronic device support portion, the electronic device support portion including a pair of shuttles, a first shuttle of the pair of shuttles being positioned at a first position along the elongated direction of the electronic device support portion and within a first track of the two parallel shuttle tracks and a second shuttle of the pair of shuttles being positioned at a second position along the elongated direction of the electronic device support portion and within a second track of the two parallel shuttle tracks;

a clamp member including a base, a first arched clamp portion, a second arched clamp portion, and a hinge, the base being slidably coupled to the clamp support portion of the coupling member, the first clamp portion being attached to the base and oriented such that a second end of the first clamp portion is closer to the electronic device support portion of the coupling member than is a first end of the first clamp portion, the hinge pivotally coupling the first end of the first clamp portion to a first end of the second clamp portion such that the second clamp portion is positioned opposite the first clamp portion when the clamp member is closed; and a latch mechanism positioned at a second end of the first clamp portion and a second end of the second clamp portion, the latch mechanism configured to latch the second end of the first clamp portion to the second end of the second clamp portion after the first clamp portion and the second clamp portion are positioned about the support structure.

16. The electronic device of claim 15, wherein the clamp support portion of the coupling member defines a channel along a length thereof and wherein the base of the clamp member includes a protrusion that fits into the channel of the clamp support portion and enables a position of the clamp member to be adjusted relative to a position of the electronic device support portion of the coupling member.

17. The electronic device of claim 15, wherein the second clamp portion of the clamp member has an outward radial extension at the second end thereof, the outward radial extension defining a slot, and wherein the latch mechanism includes:

a threaded rod having a first end and a second end, the first end of the threaded rod being coupled to the second end of the first clamp portion of the clamp member at a hinge joint; and a latch nut disposed on the threaded rod so as to be on an outer side of the outward radial extension when the threaded rod is rotated about the hinge joint and positioned in the slot of the outward radial extension to permit tightening of the latch nut against the outer side of the outward radial extension.

18. The electronic device of claim 15, wherein the electronic device support portion of the coupling member further includes:

a non-conductive spacer positioned between the pair of shuttles and a surface of the electronic device support portion.

* * * * *